(12) United States Patent
Taylor

(10) Patent No.: US 7,589,401 B2
(45) Date of Patent: Sep. 15, 2009

(54) LIGHTWEIGHT, HERMETICALLY SEALED PACKAGE HAVING AUXILIARY, SELECTIVELY CONTOURED, LOW MASS, PSEUDO WALL INSERT FOR SURFACE-MOUNTING AND DISSIPATING HEAT FROM ELECTRONIC CIRCUIT COMPONENTS

(75) Inventor: Edward Allen Taylor, West Melbourne, FL (US)

(73) Assignees: SRI Hermetics Inc., Melbourne, FL (US); H-Tech, LLC, W. Melbourne, FL (US)

( * ) Notice: Subject to any disclaimer, the term of this patent is extended or adjusted under 35 U.S.C. 154(b) by 602 days.

(21) Appl. No.: 11/463,383

(22) Filed: Aug. 9, 2006

(65) Prior Publication Data
US 2008/0036075 A1    Feb. 14, 2008

(51) Int. Cl.
*H01L 23/43* (2006.01)

(52) U.S. Cl. ............... 257/675; 257/720; 257/E23.051; 361/710

(58) Field of Classification Search ................. 428/614, 428/469, 472; 361/710, 707, 708; 257/720, 257/675
See application file for complete search history.

(56) References Cited

U.S. PATENT DOCUMENTS

| | | | |
|---|---|---|---|
| 6,284,389 B1 * | 9/2001 | Jones et al. ................. | 428/614 |
| 6,355,362 B1 | 3/2002 | Jones et al. ................. | 428/614 |

* cited by examiner

*Primary Examiner*—Leonardo Andújar
(74) *Attorney, Agent, or Firm*—Allen, Dyer, Doppelt, Milbrath & Gilchrist, P.A.

(57) ABSTRACT

A hermetically sealed package for electronic circuit components includes a generally hollow, titanium body, having a reduced thickness bottom wall/floor, whose interior surface is laminated with a relatively low mass, insert, upon which electronic circuit components are mounted. The insert has a high thermal conductivity and a low coefficient of thermal expansion, approximate to that of the housing body.

19 Claims, 3 Drawing Sheets

LIGHTWEIGHT, HERMETICALLY SEALED PACKAGE HAVING AUXILIARY, SELECTIVELY CONTOURED, LOW MASS, PSEUDO WALL INSERT FOR SURFACE-MOUNTING AND DISSIPATING HEAT FROM ELECTRONIC CIRCUIT COMPONENTS

FIELD OF THE INVENTION

The present invention relates in general to packaging structures of the type employed for hermetically sealed electronic circuits and components thereof, and is particularly directed to a lightweight, hermetically sealed electronics package, that includes a generally hollow, external housing body component, made from a material such as titanium, which has a relatively low coefficient of thermal expansion (CTE), in which is placed a relatively low mass, auxiliary, heat-dissipating, internal pseudo wall (e.g., bottom wall/floor) insert, that replaces a substantial volume of the high mass titanium material, and thereby effectively reduces the total mass of the package relative to a structure made entirely of high mass titanium.

The relatively low mass, pseudo wall/floor insert is made of a material having a relatively high thermal conductivity and a relatively low coefficient of thermal expansion, approximate to that of the material of the housing body component in which the internal pseudo wall/floor insert is placed. The top surface of the insert may be selectively contoured, as necessary, so as to locate top surfaces of various electronic circuit components mounted thereon in the same plane. This serves to effectively improve electrical performance by creating matched impedance transitions in the wires that extend from one circuit to the next, as well as facilitating automated, co-planar wire-bonding to lead attachment locations of surface-mounted electronic circuit components supported thereby.

The (generally flat) bottom surface of the insert effectively conforms with the generally flat interior surface of a wall (e.g., bottom wall/floor) of the housing body component from which heat is to be extracted and against which the insert is placed, the insert being compressed against this housing wall/floor by way of fittings, such as rivets, that are retained in apertures through a reduced thickness wall of the housing body component and are hermetically sealed against the exterior surface of the wall of the housing body component, thereby eliminating the need to use an adhesive material, such as thermally conductive epoxy, as in conventional packaging structures. The combination of the insert and the 'thinned' body wall of the housing body component provides for dispersed dissipation therethrough of heat generated by the electronic circuit components mounted on the insert, so that the heat may radiate out of the exterior surface of the housing body.

BACKGROUND OF THE INVENTION

A wide variety of electronic systems and subsystems, such as, but not limited to those employed in airborne and space-borne signal collection and processing applications, require that their electronic circuits and components of such circuits be housing in packaging structures that are lightweight, have the capability of efficiently dissipating heat, and can be hermetically sealed against the surrounding environment. One example of a conventional packaging structure designed for this purpose is disclosed in the U.S. patent to Jones et al, No. 6,355,362 (hereinafter referred to as the '362 patent).

As described therein, and as diagrammatically illustrated in the respective plan and cross-sectional views of FIGS. 1 and 2, which respectively correspond to FIGS. 7A and 7B of the '362 patent, the electronics packaging structure of the prior art comprises a generally rectangular-configured body 10 having a hollow interior space, that is defined by a bottom interior floor 12 and adjacent sidewalls 14-17. The package body 10 is made of a material having a relatively low coefficient of thermal expansion, so that it may be readily hermetically sealed and generally comply with intended physical parameters of the support assembly to which it is mounted. To this end, the package body 10 is typically made of titanium or an alloy thereof. Unfortunately, titanium has a relatively poor thermal conductivity relative to that of other materials, such as aluminum (which cannot be used due to its relatively high CTE), so that it will not readily allow the removal therethrough of heat generated by the electronic circuit components to be retained within the interior space of package body 10.

In an effort to accommodate the low thermal conductivity of titanium, the bottom floor 14 of the prior art packaging structure according to the '362 patent is selectively penetrated by a plurality of bores or apertures (four of which are shown). These bores are selectively placed at locations of the floor 14 where circuit components are to be installed, and have their internal volumes sized to accommodate a minimum amount of a high thermal conductivity, low CTE, secondary material, that is able to remove sufficient heat for maintaining proper operation of circuit components mounted thereon, while minimizing the mass thereof. Filling these bores with such secondary material forms respective intrusive heat sink regions 20A-20D, that penetrate the bottom floor 12 of the package body. Placement of a heat removal member, such as a cold plate, against the bottom of the package 10 to which the heat sink regions 20A-20D extend allows heat to be removed from circuit components mounted thereon. (In some conventional packages, rather than directly abut a respective circuit component against its associated heat sink region, the bottom of the circuit component may be mounted against an additional heat sink element which, in turn, is mechanically attached to the heat sink region by means of a thermally conductive epoxy adhesive. Unfortunately, because thermally conductive epoxy contains dielectric material, its thermal conductivity is less than that provided by a purely metal interface.)

In addition to having a relatively high thermal conductivity (in order to cool the circuit components), the secondary material of the heat sink regions 20A-20D has a relatively low CTE proximate to that of the (titanium) package body 10, so that the heat sink regions may be hermetically sealed with the bottom of the package body 10. Secondary materials listed in the '362 patent include molybdenum alloys, such as copper-molybdenum alloy (whose component percentages may be defined so that its CTE matches the CTE of the titanium body), and aluminum-silicon-carbide (AlSiC), whose CTE is proximate to (slightly less than) that of the titanium body 10.

A major shortcoming of the architecture of the prior art electronics package structure disclosed in the '362 patent is the fact that it is process-intensive, and therefore costly, since formation of the heat sink bores in the bottom floor of the package body involves a precision machining tolerance operation, in order to accurately form the bores at the exact locations where the circuit components are installed. In addition, for optimal hermetic sealing (minimal mechanical stress at the hermetic joints) of the heat sink regions with the titanium housing, it is preferred that the secondary material of the heat sink regions have a CTE that effectively matches that of the titanium body. Although this can be accomplished by employing copper-molybdenum alloy as the secondary material, the use of such an alloy entails a substantial weight penalty, as the weight of Cu—Mo alloy is on the order of three times the weight of titanium.

SUMMARY OF THE INVENTION

In accordance with the present invention, these and other drawbacks of conventional hermetically sealed electronics package structures, such as that described in the above-referenced '362 patent, are effectively obviated by a new and improved lightweight, hermetically sealed electronics package architecture, that contains an auxiliary, reduced mass, heat-dissipating, pseudo wall/floor insert, made of a material, such as, but not limited to, aluminum/silicon alloy, having relatively high thermal and electrical conductivity, and a relatively low CTE. The reduced mass insert is installed in intimate contact with a reduced thickness wall/floor of the package body upon which electronic circuit components are mounted and through which heat generated by such components is to be extracted. The reduced thickness of this wall/floor of the package body, coupled with the fact that the total area of the insert is considerably larger than the sum of the areas of the relatively narrow cross-sections of the bore-installed heat sink regions of the prior art package of the '362 patent, facilitates dissipation of heat from electronic circuit components that are mounted to a top surface portion of the insert through the laminate combination of the insert and the 'thinned' floor/wall of the package body.

The top surface of the insert is selectively contoured or stepped, as necessary, to provide different surface elevations thereon, that accommodate surface-mounted circuit components of different thicknesses, so that the top portions (where wirebond attachments are to be made) of all the circuit components that are mounted on the insert are caused to be effectively co-planar, thereby providing improved electrical performance by creating matched impedance transitions in the wires that extend from one circuit to the next. It also facilitates automated, co-planar wire-bonding to lead attachment locations of surface-mounted electronic circuit components.

The bottom surface of the insert has the same (e.g. flat) surface contour as the reduced thickness wall (e.g., bottom wall/floor) of the package body, so that the insert may be readily compressed (without the need for a joining/adhesive material, such as epoxy) against the package's bottom wall/floor by fittings (such as titanium rivets) that pass through the package body wall. The fittings are preferably made of the same (low CTE) material (e.g., titanium) as the package body, so that they may be readily optimally hermetically sealed against the exterior surface of the package body wall. As a result, thermal energy emanating from electronic circuit components supported on the top surface of the insert will be dispersed through the insert and its intimately adjoined reduced thickness package body wall, so that it may radiate out of the exterior surface of the package body, thereby cooling the electronic circuit components.

DETAILED DESCRIPTION

Figure 2:
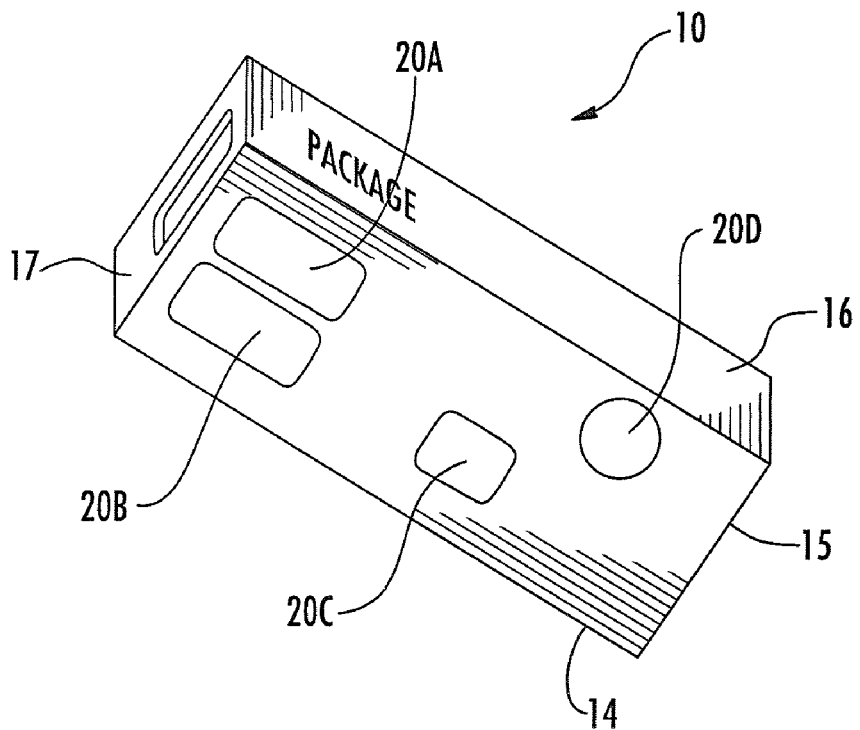
FIG. 2 corresponds to FIG. 7B of the above-referenced '362 patent, which a perspective bottom view of an embodiment of a hermetically sealed electronics packaging structure having intrusive heat sinks.
Figure 3:
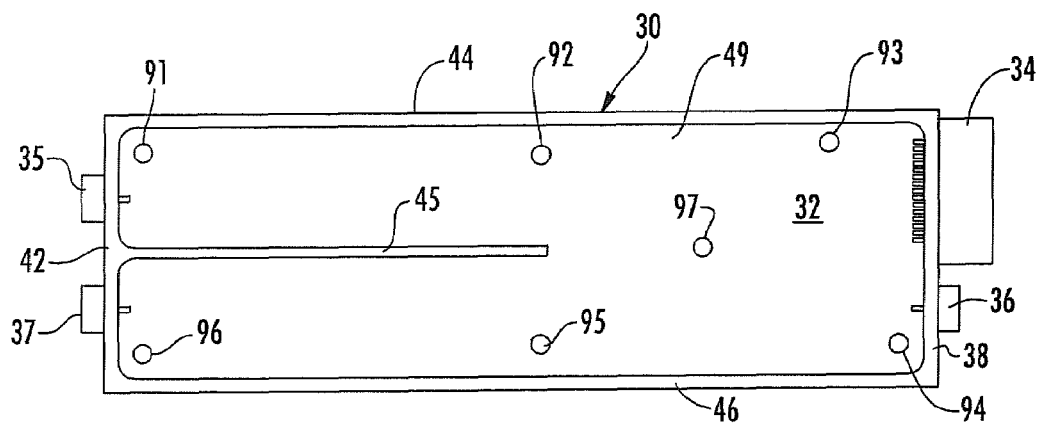
FIG. 3 is a diagrammatic plan view of the package body of a lightweight, hermetically sealed electronics packaging architecture in accordance with an embodiment of the present invention.
Figure 4:
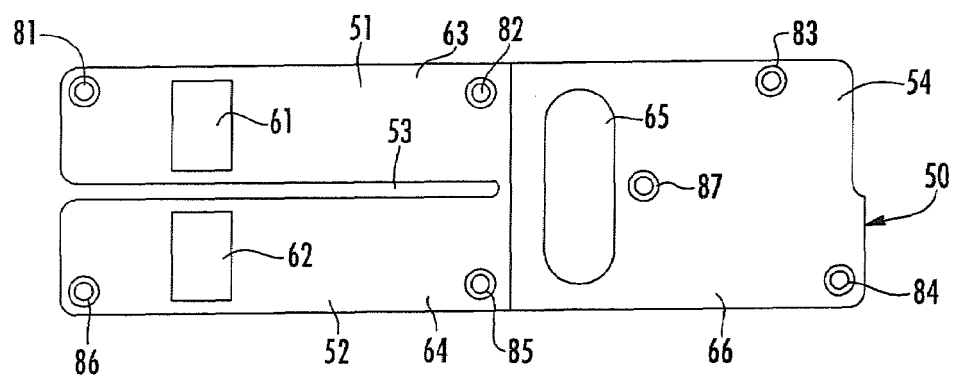
FIG. 4 is a diagrammatic plan view of an auxiliary pseudo wall/floor insert that is installable in the package body of FIG. 3.
Figure 5:
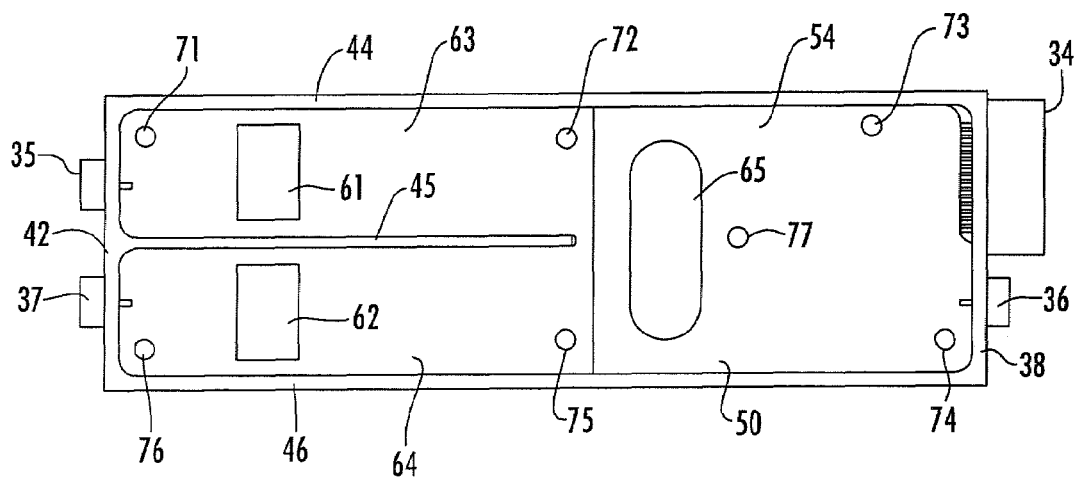
FIG. 5 is a diagrammatic plan view of a lightweight, hermetically sealed electronics packaging architecture in accordance with an embodiment of the present invention, showing the auxiliary pseudo wall/floor insert of FIG. 4 installed in the package body of FIG. 4.
Figure 6:
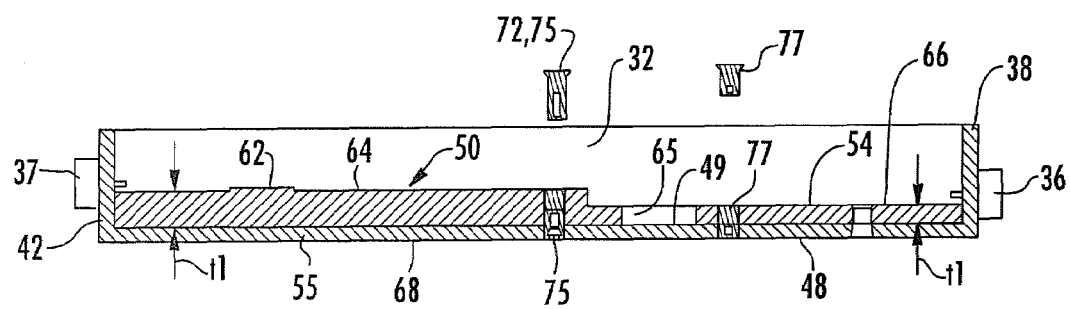
FIG. 6 is a diagrammatic cross-sectional view of the lightweight, hermetically sealed electronics packaging architecture of FIG. 5.

Attention is directed to FIGS. 3-6, which diagrammatically illustrate the structural architecture of a non-limiting embodiment of a lightweight, hermetically sealed electronics packaging architecture in accordance with the present invention. As shown in FIGS. 3, 5 and 6, similar to the prior art packaging structure of FIGS. 1 and 2, the basic housing component of the packaging architecture of the invention comprises a generally rectangular-configured, hollow body 30. Body 30 has an interior hollow volume 32 that is sized to accommodate a plurality of electronic circuit components of various shapes and sizes, such that the circuit components may be effectively hermetically sealed against the exterior environment. Electrical connections to these circuit components are provided by one or more electrical feed-through connectors, such as a multi-pin connector 34 and a single pin connector 36, installed within an end wall 38, and single pin connectors 35 and 37 installed in an opposing end wall 42.

The hollow interior volume 32 of the packaging body 30 is defined and bounded by end wall 38, opposing end wall 42, a pair of adjoining sidewalls 44 and 46, and a bottom wall or floor 48, as well as a (generally rectangular) cover or lid (not shown), that attaches to and is hermetically sealed with top surfaces of the end and side walls of the packaging body. In the illustrated housing structure example, package body 30 additionally includes a center wall 45, that extends from end wall 42 partially into the interior volume 32 of the package body.

Figure 1:
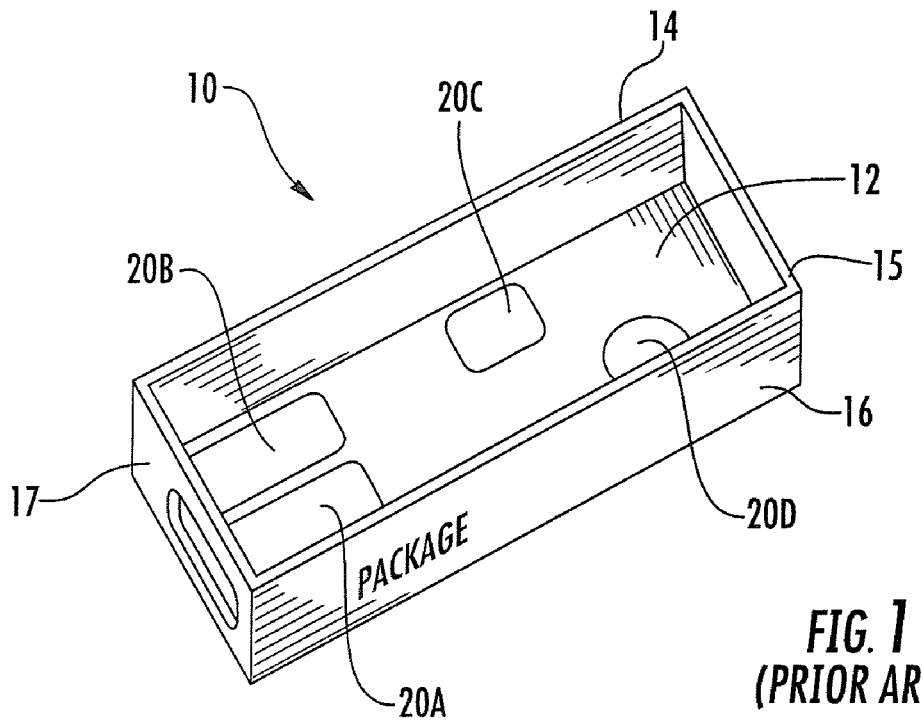
FIG. 1 corresponds to FIG. 7A of the above-referenced '362 patent, which is a perspective top view of an embodiment of a hermetically sealed electronics packaging structure having intrusive heat sinks.

As with the prior art structure of FIGS. 1 and 2, the package body 30 is made of a material, such as titanium or an alloy thereof, as a non-limiting example, which is electrically conductive, and has a relatively low coefficient of thermal expansion, so that it may be readily hermetically sealed, provide an electrical ground path therethrough, and generally comply with intended physical parameters of the support assembly to which it is mounted. However, the thickness of that package body wall upon which electronic circuits are mounted and from which heat is to be removed therefrom, which, in the illustrated example, is the floor 48 of the titanium package body 30 (although it could also be a side wall of the package body), is reduced relative to that of the structures of the prior art, which serves to decrease the weight of the package.

More particularly, in place of the material of the titanium floor that has been removed to reduce its thickness (and thereby overall mass), an auxiliary, relatively lightweight, 'pseudo' internal wall/floor insert 50, is installed in intimate contact with the interior surface 49 of the bottom wall or floor 48 of the package body. By 'lightweight' is meant that the insert 50 is made of a material having a specific gravity that is less than that of the (titanium) body 30. Moreover, insert 50 has a relatively high thermal conductivity and a relatively low CTE, so as to provide thermally conductive functionality and minimize (thermally induced) mechanical stress between the insert and the bottom of the package body with which it is in intimate contact. For this purpose, insert 50 may comprise a composite material containing aluminum and silicon (e.g., aluminum/silicon alloy), as a non-limiting example.

The top surface of the insert 50, upon which circuit components are to be mounted, is preferably plated with an electrically conductive material, such as a nickel/gold plate, so as to facilitate intimate electrical continuity between the insert and the circuit components mounted thereon. Insert 50 is sized to overlay that portion of the package body wall (e.g., bottom wall or floor 48) where circuit components are to be installed. While this may include the entire area of the package body bottom wall/floor, the insert may also be sized smaller than the total area of the wall/floor, where circuit components are to occupy only a portion of the available area of the interior surface of the package body wall/floor.

In addition, the thickness dimension of the insert may be selectively contoured or 'stepped', as necessary, to provide different elevations at various surface thereof, so as to accommodate surface-mounted circuit components of different thicknesses, and effectively place the top portions (where wirebond attachments are to be made) of the various size circuit components in a common plane, thereby facilitating improved electrical performance by creating matched impedance transitions in the wires that extend from one circuit to the next. This also serves to facilitate automated, co-planar wirebonding to lead attachment locations of surface-mounted electronic circuit components supported thereby.

In the package configuration example depicted in FIGS. 4-6, insert 50 includes first and second, generally flat finger portions 51 and 52, that are mutually separated by a relatively narrow gap 53 (which is sized to accommodate the wall 45 of the package body), and an adjoining third, generally flat land portion 54. The finger portions 51 and 52 of the insert 50 have a first thickness t1, and extend from end wall 42 alongside respective sidewalls 44 and 46 to the generally flat land portion 54. This generally flat land portion has a second thickness t2, that is stepped down from or reduced in elevation relative to the thickness t1 of the finger portions 51 and 52, and extends from the end wall 38 alongside sidewalls 44 and 46 and terminates at adjoining, generally flat finger portions 51 and 52.

Finger portions 51 and 52 of insert 50 are shown as including respective, generally rectangular mesas 61 and 62. These mesas rise slightly above or are slightly vertically offset from the top surfaces 63 and 64 of the finger portions 51 and 52, and are shaped and sized to receive and surface-mount thereon circuit components at those locations. The land portion 54 of the insert 50 is also shown as including a generally rectangular oval-shaped depression or slot 65. This slot extends from the generally flat top surface 66 of land portion 54 down to the interior surface 49 of the bottom wall/floor 48 of the package body, and is shaped and sized to accommodate the insertion therein of one or more portions of one or more circuit components therein.

As shown in the side view of FIG. 6, the bottom surface 55 of the insert 50 has the same surface contour (e.g. a generally flat contour) as the interior surface 49 of the package body's floor 48. This effectively allows the entirety of the bottom surface 55 of the insert 50 to be placed and retained in intimate, continuous thermal and electrical contact with the interior surface 49 of the bottom wall/floor 48. Such intimate retention of the insert 50 against the interior surface 49 of the package body floor 48 may be effected by way of a plurality of spatially distributed, floor attachment fittings that join the pseudo floor 50 with the bottom wall 48 of the package body 30. Such fitting may comprise rivets, seven of which are shown at 71, 72, 73, 74, 75, 76 and 77, that pass through associated apertures 81, 82, 83, 84, 85, 86 and 87 through the auxiliary insert 50 and apertures 91, 92, 93, 94, 95, 96 and 97 through the bottom wall/floor 48.

These attachment fittings are preferably made of the same low CTE material (e.g., titanium) as the floor of the package body, so that they may be readily laser welded and thereby hermetically sealed with the exterior surface 68 of the bottom wall/floor 48 of the package body 30. To facilitate laser welding of the fittings (titanium rivets) with the surrounding (titanium) material of the exterior surface of the bottom floor of the package body, the fitting bores are preferably countersunk and the heads of the fittings swaged, so as to realize relatively smooth hermetic sealing laser-weld attachment interfaces between the fittings and the external surface of the package body.

The spatial locations of the apertures in the insert and bottom wall/floor of the package body through which the insert attachment fittings pass are such that they do not encroach upon mounting locations of the circuit components on the insert. Fortunately, tolerances associated with the placement of such fittings in the packaging architecture of the invention is relatively low, as the fittings can be located substantially anywhere within the adjoining areas of the insert and the wall of the package body against which it is affixed, other than where circuit components are to be placed on the insert. This is in contrast to the very tight tolerances necessary to precisely locate the very narrow confines of the secondary material-containing heat sink bores in the electronics package of the prior art structure of FIGS. 1 and 2, described above.

As they retain the insert 50 in intimate contact with the bottom of the package body 30, the attachment fittings compress the bottom surface of the insert directly against the interior surface 49 of the package body floor 48 (which eliminates the need for a conductive epoxy, as in the prior art, described previously), and thereby integrally affix the insert 50 to the package body. This results in a laminate structure (comprised of the insert 50 and the bottom wall or floor 48 of the package body 30), that provides a substantially continuous, relatively large area, thermally and electrically conductive path through the insert to the adjoining wall of the package body from circuit component surface-mounting locations on the insert.

This laminate floor structure inherently increases the effective thickness of and thereby strengthens the reduced thickness wall of the package body. As a consequence, the thickness dimension of the wall of the package body against which the insert is mounted may be reduced relative to that of a conventional package body, which does not have the auxiliary insert of the invention. As pointed out above, such a 'thinning' of the floor or bottom wall of the package body serves to reduce the mass of the package body (making it more lightweight). It also decreases the effective thermal resistance therethrough, thereby facilitating heat flow away from the circuit components, and out of the package, as thermal energy is dispersed through the relatively large area auxiliary floor insert and into and through the 'thinned' (titanium) material of the bottom wall of the package body case, to a cold plate (not shown) adjoining the exterior surface 68 of the bottom wall 48 of the package body 30.

As will be appreciated from the foregoing description, the hermetically sealed electronics package architecture of the present invention effectively obviates shortcomings of conventional hermetically sealed electronics package structures, such as that described in the above-referenced '362 patent, by reducing the thickness of a relatively high mass housing wall (e.g., floor) and replacing the removed portion of the high mass housing wall/floor material with an auxiliary, reduced mass, pseudo wall/floor insert, that has relatively high thermal and electrical conductivity, and a relatively low CTE. The reduced thickness of the bottom wall/floor of the package body, coupled with the fact that the total area of the insert is considerably larger than the sum of the areas of the relatively narrow cross-sections of the intrusive heat sink regions of the prior art, facilitates dissipation of heat away from electronic circuit components mounted to a top surface portion of the insert, through the laminate combination of the insert and the adjoining 'thinned' wall of the package body.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. A hermetically sealed electronics packaging architecture comprising:
    a generally hollow housing body, made of a first material that is electrically conductive and has a relatively low coefficient of thermal expansion (CTE), and having a relatively thin wall upon which heat-generating electronic circuit components are supported and through which heat generated by said components is to be extracted; and
    an auxiliary, heat-dissipating, insert, having a top surface that is configured to support said heat-generating electronic circuit components, and being made of a second material, different from said first material, and having a relatively high electrical and thermal conductivity, and having a relatively low coefficient of thermal expansion that is approximate to that of said first material, and having a bottom surface that effectively conforms with an interior surface of said wall of said housing body, and being compressed thereagainst by way of fittings, that are retained in apertures through said wall of said housing body and are hermetically sealed against an exterior surface of said wall of said housing body, whereby thermal energy emanating from electronic circuit components supported on said top surface of said insert is dispersed through said insert and said wall of said housing body, and radiates out said exterior surface of said housing body, thereby cooling said electronic circuit components.

2. The packaging architecture according to claim 1, wherein said top surface of said insert is selectively contoured, to effectively provide for matched impedance transitions in wires that extend between respective ones of electronic circuit components supported thereby, and to facilitate wire-bonding to lead attachment locations of said electronic circuit components.

3. The packaging architecture according to claim 1, wherein said first material has a first specific gravity, and said second material has a second specific gravity that is less than said first specific gravity.

4. The packaging architecture according to claim 3, wherein said first material comprises titanium and said second material comprises aluminum/silicon alloy.

5. The packaging architecture according to claim 1, wherein said top surface of said insert is configured to receive and directly abut against bottom surfaces of said electronic circuit components supported thereon, and wherein the total area of said top surface of said insert is greater than the total area of said bottom surfaces of said electronic circuit components.

6. The packaging architecture according to claim 1, wherein said fittings pass through bores in said insert and said apertures through said wall of said housing body.

7. The packaging architecture according to claim 6, wherein said fittings are made of said first material.

8. A hermetically sealed electronics packaging architecture for housing a plurality of heat-generating electronic circuit components comprising:
    a housing body, made of a first material that is electrically conductive and has a relatively low coefficient of thermal expansion (CTE), and having a plurality of sidewalls that are joined with a relatively thin, bottom wall/floor and define therewith a generally hollow interior volume, said sidewalls being adapted to receive a cover that hermetically closes said interior volume of said housing body, and wherein one or more electrical connectors that provide electrical connections to said electronic circuit components are hermetically sealed with one or more of said sidewalls;
    a heat-dissipating, electronic circuit component-supporting, insert, having a top surface that is configured to support said electronic circuit components thereon, and being made of a second material, that is different from said first material, said second material having a relatively high electrical and thermal conductivity, and having a relatively low coefficient of thermal expansion that is approximate to that of said first material, said insert having a bottom surface that effectively conforms with an interior surface of said bottom wall/floor of said housing body, and is compressed thereagainst by way of fittings, that are mechanically joined with said insert and pass through apertures in said bottom wall/floor of said housing body, and are hermetically sealed against an exterior surface of said bottom wall/floor of said housing body, whereby thermal energy emanating from electronic circuit components supported on said top surface of said insert is dispersed through said insert and said bottom wall/floor of said housing body, and radiates out said exterior surface of said housing body, thereby cooling said electronic circuit components.

9. The packaging architecture according to claim 8, wherein said top surface of said insert is selectively contoured, so as to effectively provide for matched impedance transitions in electrical connections that extend between respective ones of electronic circuit components supported thereby, and to facilitate wire-bonding to lead attachment locations of said electronic circuit components.

10. The packaging architecture according to claim 8, wherein said first material has a first specific gravity, and said second material has a second specific gravity that is less than said first specific gravity.

11. The packaging architecture according to claim 10, wherein said first material comprises titanium and said second material comprises aluminum/silicon alloy.

12. The packaging architecture according to claim 8, wherein said top surface of said insert is configured to receive and directly abut against bottom surfaces of said electronic circuit components supported thereon, and wherein the total area of said top surface of said insert is greater than the total area of said bottom surfaces of said electronic circuit components.

13. The packaging architecture according to claim 8, wherein said fittings are made of said first material and pass through bores in said internal insert that are aligned with said apertures through said bottom wall/floor of said housing body.

14. In an electronics packaging architecture having a housing body for supporting and hermetically sealing therein a plurality of heat-generating electronic circuit components, said housing body comprising a first material having a first specific gravity, and being electrically conductive and having a relatively low coefficient of thermal expansion (CTE), said housing body including a bottom wall and a plurality of sidewalls that are adapted to receive a cover and are joined with said bottom wall, so as to form a generally hollow interior volume of said housing body in which said electronic circuit components are hermetically sealed, and wherein one or more electrical connectors that provide electrical connections to said electronic circuit components are hermetically sealed with one or more of said sidewalls, the improvement comprising:

a heat-dissipating, electronic circuit component-supporting, insert, having a top surface that is configured to support said electronic circuit components thereon, and being made of a second material having a second specific gravity that is less than said first specific gravity, said second material having a relatively high electrical and thermal conductivity, and having a relatively low coefficient of thermal expansion that is approximate to that of said first material, said insert having a bottom surface, which effectively conforms with an interior surface of a wall of said housing body through heat generated by said electronic circuit components is to be removed, and wherein said of said housing body has a thickness that is reduced relative that of a housing body not containing said insert, so that the total mass of said wall of said housing body and said insert is less than the total mass of the wall of said housing body not containing said insert, and wherein said insert is compressed against said interior surface of said wall of said housing body so as to form a laminate structure therewith, by fittings, that are mechanically joined with said insert and pass through apertures in said wall of said housing body, and are hermetically sealed against an exterior surface of said wall of said housing body, whereby thermal energy emanating from electronic circuit components supported on said top surface of said insert is dispersed through said insert and said wall of said housing body, and radiates out said exterior surface of said housing body, thereby cooling said electronic circuit components.

15. The improvement according to claim 14, wherein said top surface of said insert is selectively contoured, so as to effectively provide for matched impedance transitions in electrical connections that extend between respective ones of electronic circuit components supported thereby, and to facilitate wire-bonding to lead attachment locations of said electronic circuit components.

16. The improvement according to claim 14, wherein said first material comprises titanium and said second material comprises aluminum/silicon alloy.

17. The improvement according to claim 14, wherein said top surface of said insert is configured to receive and directly abut against bottom surfaces of said electronic circuit components supported thereon, and wherein the total area of said top surface of said insert is greater than the total area of said bottom surfaces of said electronic circuit components.

18. The improvement according to claim 14, wherein said fittings are made of said first material and pass through bores in said internal insert that are aligned with said apertures through said wall of said housing body.

19. The improvement according to claim 14, wherein said wall of said housing body corresponds to said bottom wall thereof.

* * * * *